United States Patent [19]

Chen et al.

[11] Patent Number: 5,661,083
[45] Date of Patent: Aug. 26, 1997

[54] METHOD FOR VIA FORMATION WITH REDUCED CONTACT RESISTANCE

[75] Inventors: Song Chen, Sunnyvale; Chun Ya Chen, Saratoga, both of Calif.

[73] Assignee: Integrated Device Technology, Inc., Santa Clara, Calif.

[21] Appl. No.: 594,010

[22] Filed: Jan. 30, 1996

[51] Int. Cl.$^6$ ................................................. H01L 21/768
[52] U.S. Cl. .......................... 438/637; 438/695; 438/970; 438/702; 438/712; 438/625
[58] Field of Search ........................... 437/192, 195, 437/238, 245, 228 ES; 156/646.1, 652.1, 653.1

[56] References Cited

U.S. PATENT DOCUMENTS

| | | | |
|---|---|---|---|
| 4,745,042 | 5/1988 | Sasago et al. | 430/156 |
| 4,758,528 | 7/1988 | Goth et al. | 437/147 |
| 4,814,041 | 3/1989 | Auda | 437/981 |
| 4,816,115 | 3/1989 | Horner et al. | 437/241 |
| 4,943,539 | 7/1990 | Wilson et al. | 437/192 |
| 5,296,404 | 3/1994 | Akahori et al. | 437/195 |
| 5,376,573 | 12/1994 | Richart et al. | 437/923 |
| 5,468,342 | 11/1995 | Nulty et al. | 156/643.1 |
| 5,470,790 | 11/1995 | Myers et al. | 437/192 |

OTHER PUBLICATIONS

Wolf, S. and R. N. Tauber, Silicon Processing for the VLSI Era, vol. 1—Process Technology, Lattice Press, pp. 541, 543, 544, 546, 576, & 581 Jan. 1, 1986.

*Primary Examiner*—John Niebling
*Assistant Examiner*—Kevin Turner
*Attorney, Agent, or Firm*—Hickman Beyer & Weaver

[57] ABSTRACT

A method for forming a via in an integrated circuit having a reduced contact resistance. The integrated circuit includes a photoresist layer, an oxide layer, an etch stop layer and a metal layer. In one embodiment, a portion of the photoresist layer is removed to expose the underlying oxide layer, after which a portion of the oxide layer is removed to expose the underlying etch stop layer. A portion of the etch stop layer is then removed using a reactive ion etch-downstream microwave ash system under conditions that are effective to create a substantially water-soluble polymer residue within the via, to expose a portion of the underlying metal layer. The water-soluble polymer is then removed to expose the underlying metal layer.

26 Claims, 3 Drawing Sheets

METHOD FOR VIA FORMATION WITH REDUCED CONTACT RESISTANCE

BACKGROUND OF THE INVENTION

1. The Field of the Invention

The present invention relates to semiconductor devices and methods for the fabrication of semiconductor devices. More specifically, the present invention provides a method for constructing vias in semiconductor devices.

2. The Relevant Art

Manufacturers of semiconductor devices have turned in recent years to the construction of multiple, substantially parallel layers of circuits on a single chip in order to increase the transistor density of the chip and, thereby, the computational efficiency of the semiconductor device. Typically, the substantially parallel layers are connected through "vias"—channels extending through the dielectric layers that electrically isolate the different layers of circuitry. In general, a via is fabricated by preparing an aperture through the dielectric layer separating two electrically conductive layers. These electrically conductive layers typically are a metal such as aluminum, or copper, or they can be made from gold.

FIGS. 1A and 1B show a typical semiconductor device at 100. Generally a semiconductor device includes a substrate 102, made from a material such as silicon (Si) or gallium arsenide (GaAs), upon which is deposited a layer of a conductive material 104, such as a metal. Upon metal layer 104 is typically provided an etch stop or anti-reflective coating (ARC) 106. Over the etch stop is deposited a dielectric layer 108, usually a non-conducting oxide such as silicon dioxide ($SiO_2$). Over the oxide layer is provided a layer of photoresist 110 which is used during the lithography process to map the next layer of circuitry.

Traditionally, vias, such as via 112 in FIGS. 1A and 1B, are created by etching the photoresist and oxide down to the etch stop so that direct contact with the underlying metal is avoided. This is done primarily to avoid two undesirable processing difficulties. First, stopping the etch process at the etch stop layer avoids the well-known punch through effect. Second, etching through the etch stop layer to the underlying metal layer causes the formation of polymeric debris 114 that is extremely difficult to remove from the via. The polymeric debris is formed as a result of the plasma bombardment of the semiconductor device during the formation of the via and typically includes as its components the chemical species being used to create the plasma in addition to atoms from the metal layer, as well as atoms from the oxide, etch stop, and photoresist layers. For example, where carbon tetrafluoride ($CF_4$) is used as the processing gas, $SiO_2$ is used as the oxide layer, aluminum (Al) is used as the metal layer, and titanium tungsten (TiW) is used as the ARC, the polymeric debris formed in the via comprises polytetrafluoroethylene ($(C_2F_2)_n$) in addition to atoms of oxygen, silicon, titanium, and aluminum. Under current processing techniques, the removal of such polymeric debris to form the finished via surfaces 116, 118 typically requires a wet etchant and several processing steps that can degrade chemically the metal layer. Without removal, the polymeric debris impairs the reliability and yield of the final semiconductor product.

In general, titanium nitride (TiN) is a preferred material to use as an etch stop, as it has the advantage of generating fewer particle-related problems during deposition. Unfortunately, TiN is also characterized by poor selectivity during the oxide etching used in the formation of vias. After partial removal of the underlayer during the above-described etching process currently used, the TiN layer within each via 116 has a different thickness throughout the wafer according to the wafer topography. This heterogeneous surface structure creates contact resistance and increases electrical resistivity within the via. Thus, although TiN has very good properties in some aspects, the drawbacks with respect to etching the TiN etch stop layer are so severe that this material is typically replaced with titanium tungsten (TiW).

SUMMARY OF THE INVENTION

The present invention avoids the above-described drawbacks with respect to conventional techniques used to form vias by providing in one aspect a method for constructing a via which produces a substantially water-soluble polymer residue that is easily and efficiently removed. In another aspect the method of the present invention allows for the substantially complete removal of the etch stop layer within the via so as to provide substantially direct contact with the underlying metal layer. In a third aspect, the method of the present invention can be used with titanium nitride thus better enabling the construction of semiconductor devices with this preferable material.

In one aspect the present invention provides a method for constructing a via having a reduced contact resistance in an integrated circuit. The integrated circuit includes a photoresist layer, an oxide layer, an etch stop layer and a metal layer. In one embodiment, a portion of the photoresist layer is removed to expose the underlying oxide layer. A portion of the oxide layer is then removed to expose the underlying etch stop layer. A portion of the etch stop layer is then removed using a reactive ion etch-downstream microwave ash system under conditions that are effective to create a substantially water-soluble polymer residue within the via. The water-soluble polymer is then removed to expose substantially the underlying metal layer.

In one embodiment the etch stop layer comprises TiW or TiN. In another embodiment, the metal layer is a metal selected from the group consisting of copper (Cu), copper aluminum (CuAl), or aluminum (Al). In still another embodiment, the metal layer is aluminum and the resulting water-soluble polymer is substantially free of aluminum contamination.

In one particular embodiment of the invention, the reactive ion etch is performed under a nitrogen/hydrogen ($N_2/H_2$) atmosphere under a pressure of between about 100 millitorr (mT) and about 300 mT. In a more specific embodiment, the atmosphere further includes carbon tetrafluoride ($CF_4$). Following this first processing step a bulk resist ashing is performed, followed by a polymer removal step which, in one specific embodiment of the invention, is performed at a power level of between about 100 Watts (W) and about 300 W with a plasma frequency of about 13.65 Megahertz (MHz).

In another aspect, the present invention also provides a method of forming a semiconductor device. The method of this aspect of the invention includes providing a substrate upon which a first layer of metal is deposited. A layer of etch stop is deposited over the metal layer and a layer of oxide deposited over the etch stop layer. Finally a photoresist layer is deposited over the oxide layer. A portion of the photoresist layer is then removed to expose a portion of the oxide layer. A portion of the oxide layer is subsequently removed to expose a portion of the etch stop layer. A portion of the etch stop layer is then removed using a reactive ion etch/downstream microwave ash system under conditions effective to create a substantially water-soluble residue within the via. The polymer residue is then removed from the via to expose thereby at least a portion of the metal layer.

These and other aspects and advantages of the present invention will become apparent when the Description provided below is read in conjunction with the accompanying Drawings.

BRIEF DESCRIPTION OF THE DRAWINGS

FIG. 1A illustrates the deposition of polymeric residue following the formation of a via using conventional methods. FIG. 1B illustrates a via as formed by present methodologies which extends only partially through the etch stop layer producing thereby an uneven surface.

FIG. 2A illustrates the removal of the photoresist layer in the initial formation of a via structure. FIG. 2B illustrates the removal of the oxide layer to produce thereby a polymeric residue. FIG. 2C illustrates the final via formed which extends through the photoresist, oxide, and etch stop layers to the metal layer and is substantially free of polymeric residue.

DESCRIPTION OF SPECIFIC EMBODIMENTS

Figure 1A:
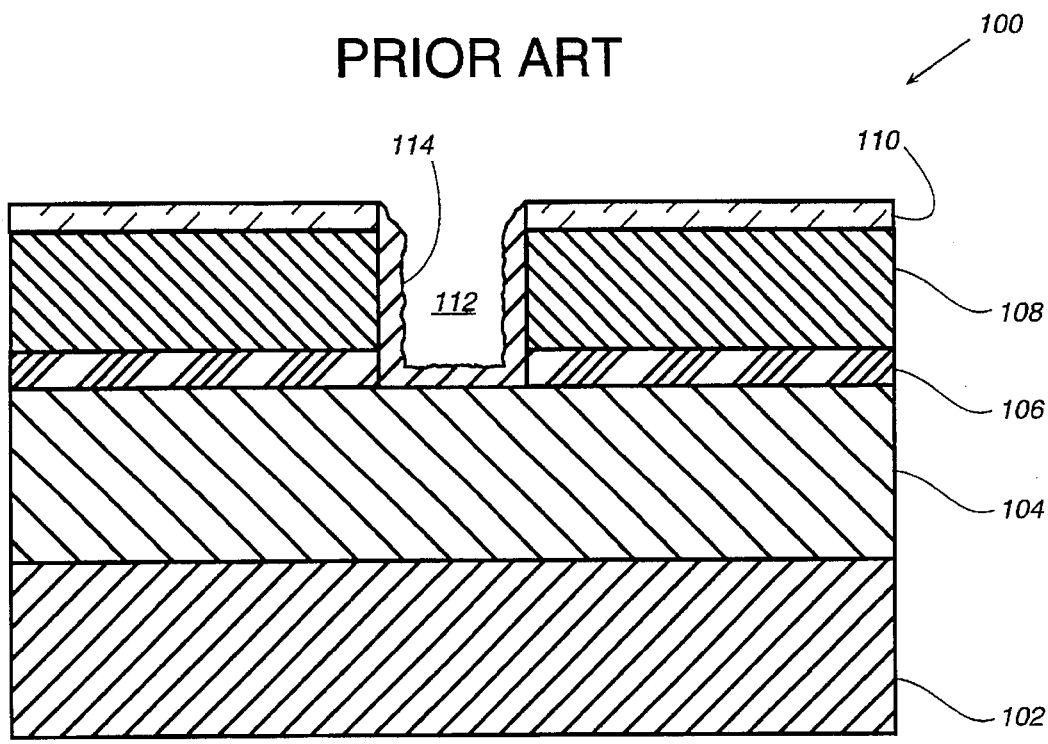
FIGS. 1A and 1B illustrate two intermediate steps in the formation of a semiconductor device according to the Prior Art.
Figure 1B:
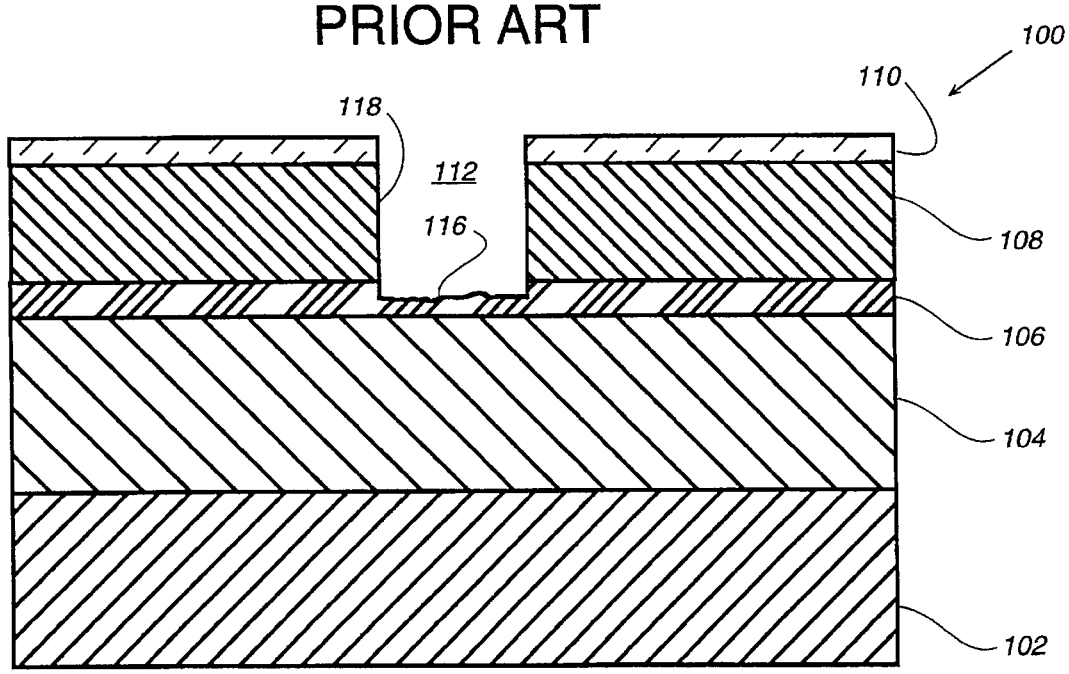
Figure 2A:
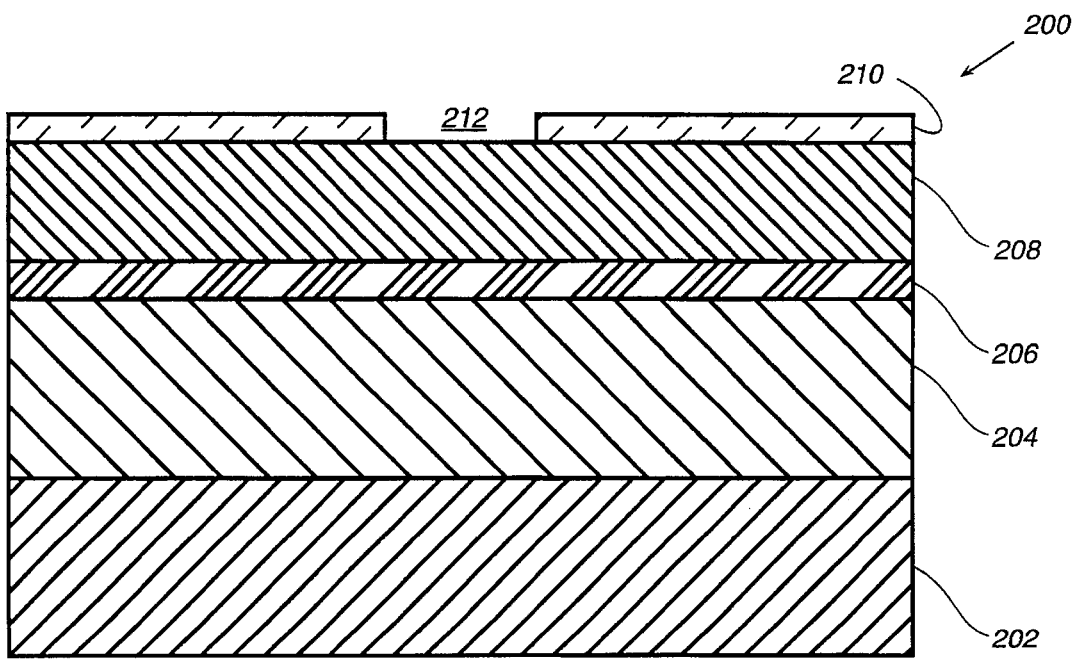
FIGS. 2A, 2B, and 2C illustrate the formation of a via according to the present invention.

FIG. 2A at 200 illustrates a first step for forming a via having substantially reduced contact resistance according to one embodiment of the method of the invention. As seen at 200 a semiconductor structure is provided which includes a semiconductor wafer 202 which can be any suitable material such as silicon or gallium arsenide. This layer may be further covered with an oxide such as silicon dioxide ($SiO_2$, not shown), as an insulating layer. Over substrate 202 is deposited a conductive layer 204 according to well known techniques in the semiconductor device arts. Conductive layer 204 can be any type of electrically conductive material capable of deposition by sputtering or similar semiconductor device fabrication technique. Examples of conductive layers include copper (Cu), aluminum (Al), or aluminum copper alloy (AlCu), for example a 99:1 AlCu alloy, which can be followed by a second sputter deposition of titanium tungsten (TiW). In one embodiment, conductive layer 204 is aluminum. The conductive layer 204 is often patterned into conductive lines using such well known techniques as photolithography, wherein a resist material is applied to the upper surface layer of the conductor surface 204 and is exposed to a patter of radiant energy and developed a form of mask. An etching process is used to remove portions of the surface of conductive layer 204 through the mask after which the mask is typically removed.

Deposited over the top of conductive layer 204 is an etch stop or anti-reflective coating (ARC) 206. This layer typically comprises TiN or TiW although it can also be an organic composition. As described above, although TiN has very useful properties with respect to its deposition, under conventional techniques TiN makes a poor etch stop as it contributes to the formation of polymeric residues that are difficult to remove during the via formation process. More typically used therefore is TiW. Deposited over the etch stop 206 is a dielectric layer 208, which typically is an oxide such as silicon dioxide ($SiO_2$). Atop this layer is a layer of photoresist 210 which is used in the photolithographic etching processes employed to construct the semiconductor device. The composition and deposition of each of these layers will be familiar to those of skill in the semiconductor fabrication arts.

Figure 2B:
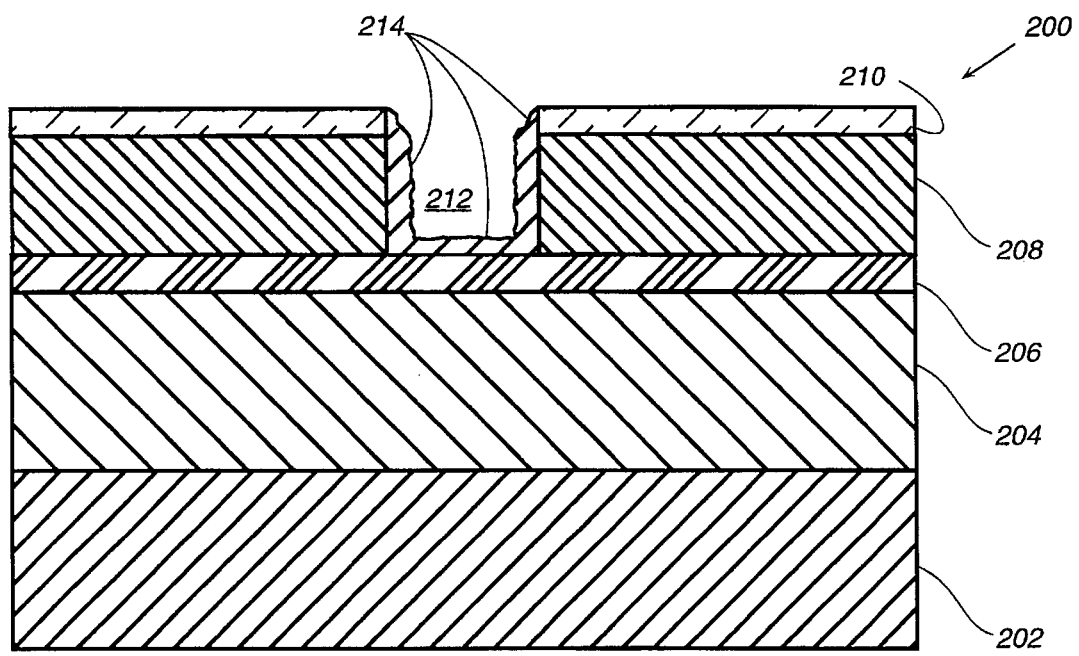

According to one embodiment of the present invention, a method for forming a via in a semiconductor device having the composition just described includes the removal of a portion of the photoresist layer 210 to form thereby an aperture 212. The removal of the photoresist to form this aperture, which is the initial step in the creation of the final via structure within the semiconductor device, will be familiar to those of skill in the semiconductor device arts. Following the removal of the photoresist portion of the device, the dielectric layer 208 is etched using standard methodologies to increase the size of the via which now extends to the etch stop layer 206 as shown in FIG. 2B. The via may be formed using either anisotropic etching or a combination isotropic and anisotropic etching. In one embodiment, both isotropic and anisotropic etching is used to form this portion of the via. The etching is allowed to continue until substantial contact is made with the etch stop layer 206. Also formed during the etching process is a coating of polymeric debris 214 which is deposited typically along the sides and floor of the via.

According to one embodiment of the present invention, a portion of the etch stop layer is then completely removed using a reactive ion etch/downstream microwave ash system to expose the underlying metal surface. This step can be performed using commercially available reactive ion etch/downstream microwave ash systems (such as commercially available from ULVAC Technologies, Inc. of Fremont, Calif.). In one embodiment, the removal of the etch stop layer is performed under a nitrogen/hydrogen atmosphere which, in one embodiment, includes carbon tetrafluoride and wherein the total pressure of all three gases ($N_2/H_2/CF_4$) is between about 100 millitorr (mT) and about 300 mT. In another embodiment the pressure of the gases in the reaction chamber is between about 100 mT and about 200 mT. In a still more specific embodiment the total pressure is maintained at about 100 mT. With respect to the gas flow rates, in one embodiment the flow rate of the $N_2/H_2$ gases is provided at about 100 standard cubic centimeters per minute (sccm) and the $CF_4$ is provided at a flow rate of about 150 sccm. With respect to power levels used to perform the ion etch, in one embodiment the power level is maintained between about 100 Watts (W) and about 400 W. In another embodiment the power level is maintained between about 200 W and about 300 W. In still another embodiment the power level is maintained at about 200 W. In this latter embodiment, the reactive ion etch is performed at a temperature of about 240° C. for a period of about 30 minutes.

Following the first ion etch, a bulk resist ash is performed using standard techniques that are known to those of skill in the semiconductor device arts. In one embodiment, the bulk photoresist ash is performed in the same apparatus described above used to perform the removal of the etch stop layer. Within the processing chamber, an atmosphere comprising oxygen, nitrogen, and hydrogen ($O_2/N_2/H_2$) having a total pressure of about 2 Torr and a flow rate for all three gases of about 300 sccm is established. The power used in this embodiment is maintained at about 1000 W at a temperature of about 240° C. until the process is completed as determined using standard methods known to those of skill in the semiconductor fabrication arts.

Following the bulk resist ashing the polymer is then substantially removed from the walls and floor of the via to provide the completed via structure. In one embodiment, the polymer removal is performed in the same apparatus as described above under an $N_2/H_2/CF_4$ atmosphere of about 500 mT and a flow rate for all three gases of about 100 sccm. In this embodiment, the power level used is maintained at a level between about 300 W with a plasma frequency of about 13.65 Megahertz (MHz). In another embodiment, the power level is maintained between about 100 W and 200 W and, in still another embodiment, the power level is maintained at about 100 W. Lower powers tend to avoid lateral etching of the ARC. In one embodiment the processing is continued for a period of about 15 minutes at a temperature of about 240° C.

Figure 2C:
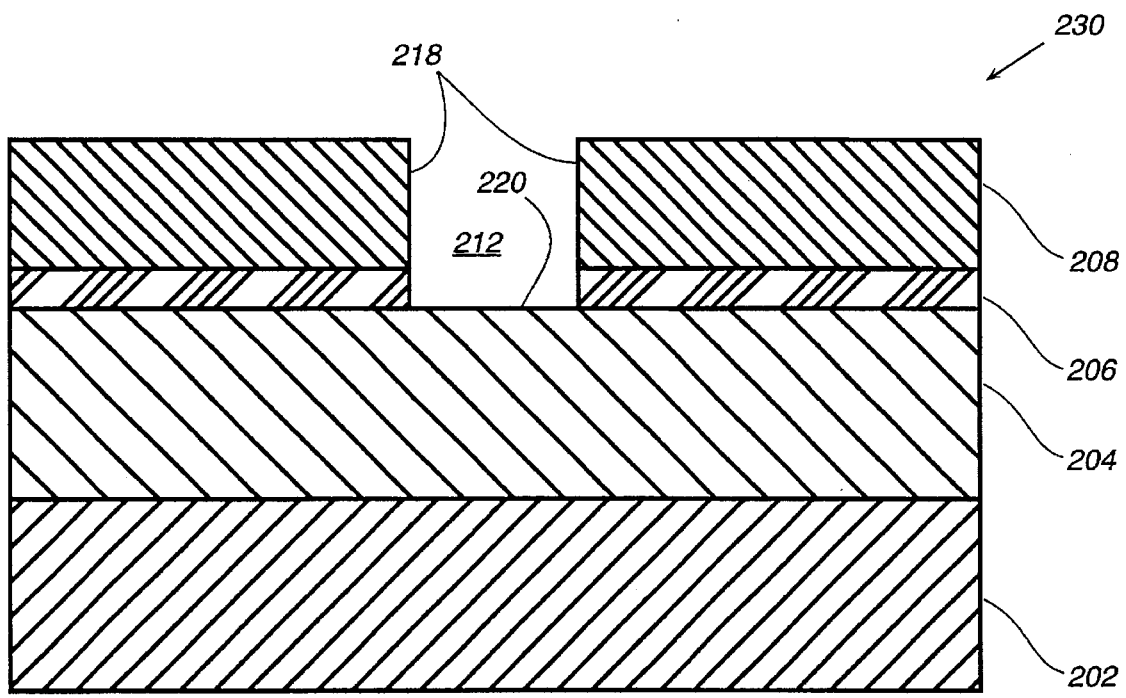

The resulting product is illustrated in FIG. 2C at 230 in which the completed via structure 212 is seen to extend through oxide layer 208, which is now the top most layer as the photoresist has been removed by the bulk ashing step described above, to the substantially expose the underlying metal layer 204. Although not wishing to be bound to any particular theory, it is believed that the use of a reactive ion etch, which avoids the application of a DC bias across the wafer, allows for substantially complete removal of the ARC within the via without ejecting significant numbers of metal atoms. The resulting polymer has been found to be substantially water-soluble and can be removed without the use of a wet etchant or additional processing steps as currently employed.

Thus, it will be appreciated that the method described herein can be used successfully in the creation of a semiconductor device. As is well known in the art the construction of a semiconductor device includes the steps of providing a substrate, providing a first metal layer over the substrate, providing an etch stop layer over the metal layer, providing an oxide layer over the etch stop layer, and providing a photoresist layer over the oxide layer. Using the method described in detail above, a portion of the photoresist layer is removed to expose a portion of the oxide layer. A portion of the oxide layer is then removed to expose a portion of the etch stop layer. Following the exposure of the etch stop layer, the steps described above of performing a first reactive ion etch, a bulk photoresist ashing, and a polymer removal using a reactive ion etch/downstream microwave ash apparatus are then employed to both remove the photoresist layer and a provide a via structure which extends through the oxide and etch stop layers to expose the metal layer.

In one embodiment the etch stop layer comprises TiW or TiN. In a more specific embodiment the etch stop layer comprises TiN. In another embodiment, the metal layer is selected from the group consisting of Cu, AlCu and Al. In a more specific embodiment the metal layer comprises Al. In addition, the method of the invention in one embodiment further includes the step of providing a second metal layer over the oxide layer exposed during the formation of the via structure such that the second metal layer is in electrical contact with the first metal layer through the via constructed using the technique described herein. The deposition of a second metal layer can be performed using techniques known to those of skill in the semiconductor device arts.

EXAMPLE

The following Example is provided solely to aid in the understanding of the present invention and should not be considered in any way as limiting the scope of the invention.

A semiconductor device comprising a 2,000 Angstrom (Å) TiW underlayer, a 4,000 Å aluminum conduction layer, a 500 Å TiN etch stop, a 1.2 micron (μm) $SiO_2$ oxide layer, and a 1.2 μm resist layer was fabricated using standard techniques and materials. A via channel of standard dimensions was formed in the resist and oxide layers using standard methods.

The device was then placed in a ULVAC ASHER reactive ion etch/downstream microwave apparatus (available commercially from ULVAC Technologies of Fremont, Calif.) under a $N_2/H_2/CF_4$ atmosphere at a pressure of 100 millitorr (mT) in which the $N_2$ and $H_2$ gases were supplied at a flow rate of 100 standard cubic centimeters per minute (sccm) and the $CF_4$ was supplied at 150 sccm. The device was then processed at 200 Watts (W) of power for 30 minutes at 240° C. to etch the TiN etch stop from the via such that no significant amounts of the metal layer were etched.

Following completion of this operation, a bulk resist ashing operation was performed by providing a $N_2/H_2/O_2$ atmosphere having a total pressure of 2 Torr. In which the $O_2$ was supplied at 5 liters and the $N_2/H_2$ mixture was supplied at 300 sccm. The processing was performed at 1,000 W at 240° C. until the processing was completed as determined by standard methods.

When the bulk resist was ashed, the polymer was removed using reactive ion etching at a microwave plasma frequency of 13.65 Megahertz (MHz) in a 500 mT atmosphere comprising $N_2/H_2/CF_4$ in which all three components were supplied at 100 sccm. The polymer removal was performed at a power of 100 W for 15 minutes at 240° C. and resulted in removal of substantially all of the polymer from the device.

Thus, it will be seen that the method described herein is capable of providing a via structure having reduced contact resistance by virtue of the substantially complete removal of the underlying etch stop layer within the via. In addition it will also be appreciated from the foregoing that the method of the invention greatly simplifies the construction of vias by allowing for the complete formation of a substantially clean via structure in a single apparatus without the need for wet etchants and multiple processing steps such as required presently to remove the polymeric residue created during the formation of the via. Thus it will be appreciated that the present invention describes a method of forming via structures with highly uniform electrical properties in a highly efficient manner.

Although the foregoing description describes certain embodiments and examples, it will be apparent to those of skill in the semiconductor device arts that changes may be made to those embodiments or examples without departing from the scope of the invention. In particular it should be appreciated that a variety of other metals, oxides and other materials will be known to those of skill in the semiconductor device arts that can be employed with he present invention using the description provided herein.

What is claimed:

1. A method for constructing a via having reduced contact resistance in an integrated circuit including a photoresist layer, an oxide layer, an etch stop layer, and a metal layer, said method comprising:

a) removing a portion of said photoresist layer so as to create an aperture therethrough, said aperture exposing said oxide layer;

b) removing said portion of said oxide layer so as to create said via therethrough, said via exposing said etch stop layer;

c) extending said via by further removing said portion of said etch stop layer using a reactive ion etch in a downstream microwave ash system under conditions effective to create a substantially water-soluble polymer residue, wherein a portion of said substantially water-soluble polymer residue is left within said via, and wherein said reactive ion etch in a downstream microwave ash system is performed within a first atmosphere comprising nitrogen and hydrogen; and d) removing substantially said substantially water-soluble polymer residue from said via so as to expose at least a portion of said metal layer.

2. The method of claim 1, wherein said etch stop layer comprises TiW or TiN.

3. The method of claim 2, wherein said etch stop layer comprises TiN.

4. The method of claim 3, wherein said metal layer comprises a metal selected from the group consisting of Cu, AlCu, or Al.

5. The method of claim 4, wherein said metal layer is Al.

6. The method of claim 5, wherein said water-soluble polymer residue is substantially free of Al.

7. The method of claim 1, wherein said reactive ion etch in a downstream microwave ash system is performed at a power level of between about 100 W and about 400 W.

8. The method of claim 7, wherein said power level is between about 200 W and about 300 W.

9. The method of claim 8, wherein said power level is about 200 W.

10. The method of claim 7, wherein said first atmosphere has a pressure of between about 100 mT and about 300 mT.

11. The method of claim 10, wherein said pressure is between about 100 mT and about 200 mT.

12. The method of claim 11, wherein said pressure is about 100 mT.

13. The method of claim 10, wherein said first atmosphere further includes $CF_4$.

14. The method of claim 13, wherein said first atmosphere includes $N_2/H_2$ provided at a flow rate of about 100 sccm and said $CF_4$ provided at a flow rate of about 150 sccm.

15. The method of claim 1, further including performing a bulk resist ashing after extending said via by further removing said portion of said etch stop layer.

16. The method of claim 1, wherein removing substantially said substantially water-soluble polymer residue is performed at a power level of between about 100 W and about 300 W with a plasma frequency of about 13.65 MHz.

17. The method of claim 16, wherein said removing substantially said substantially water-soluble polymer residue is performed under a second atmosphere comprising nitrogen and hydrogen that is maintained at a pressure of about 500 mT.

18. The method of claim 17, wherein said second atmosphere further includes $CF_4$.

19. The method of claim 18, wherein said second atmosphere includes $N_2/H_2$ provided at a flow rate of about 100 sccm and said $CF_4$ provided at a flow rate of about 100 sccm.

20. A method of forming a semiconductor device, comprising the steps of:

a) providing a substrate;

b) providing a first metal layer over said substrate;

c) providing an etch stop layer over said metal layer;

d) providing an oxide layer over said etch stop layer;

e) providing a photoresist layer over said oxide layer;

f) removing a portion of said photoresist layer so as to create an aperture therethrough, said aperture exposing a portion of said oxide layer;

g) removing said portion of said oxide layer so as to create a via therethrough, said via exposing a portion of said etch stop layer;

h) extending said via by further removing said portion of said etch stop layer using a reactive ion etch in a downstream microwave ash system under conditions effective to create a substantially water-soluble polymer residue, wherein a portion of said substantially water-soluble polymer residue is left within said via, and wherein said reactive ion etch in a downstream microwave ash system is performed within a first atmosphere comprising nitrogen and hydrogen; and i) removing substantially said substantially water-soluble polymer residue from said via so as to expose at least a portion of said metal layer.

21. The method of claim 20, wherein said etch stop layer comprises TiW or TiN.

22. The method of claim 21, wherein said etch stop layer comprises TiN.

23. The method of claim 22, wherein said metal layer comprises Al.

24. The method of claim 23, wherein said substantially water-soluble polymer residue is substantially free of Al.

25. The method of claim 20, further including the step of providing a second metal layer which second metal layer is in electrical contact with said first metal layer through said via.

26. In a downstream microwave ash system, a method for forming a via having a reduced resistance within a semiconductor device, said method comprising:

etching away a portion of an etch stop layer within said semiconductor device in a $N_2/H_2/CF_4$ atmosphere so as to form said via that extends substantially through said etch stop layer, wherein said etching causes a substantially water-soluble polymer residue to form within said via; and further removing substantially said substantially water-soluble polymer residue from within said via in a nitrogen and hydrogen atmosphere so as to cause said via to extend through said etch stop layer and thereby exposing a portion of an underlying conducting layer.

\* \* \* \* \*